United States Patent
Wuu et al.

(10) Patent No.: US 11,804,479 B2
(45) Date of Patent: Oct. 31, 2023

(54) SCHEME FOR ENABLING DIE REUSE IN 3D STACKED PRODUCTS

(71) Applicant: Advanced Micro Devices, Inc., Santa Clara, CA (US)

(72) Inventors: John J. Wuu, Fort Collins, CO (US); Milind S. Bhagavat, Los Altos, CA (US); Brett P. Wilkerson, Austin, TX (US); Rahul Agarwal, Livermore, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/586,309

(22) Filed: Sep. 27, 2019

(65) Prior Publication Data

US 2021/0098441 A1 Apr. 1, 2021

(51) Int. Cl.
*H01L 25/18* (2023.01)
*H01L 23/48* (2006.01)
*H01L 23/528* (2006.01)
*H01L 23/00* (2006.01)

(52) U.S. Cl.
CPC ............ *H01L 25/18* (2013.01); *H01L 23/481* (2013.01); *H01L 23/528* (2013.01); *H01L 24/05* (2013.01); *H01L 24/08* (2013.01); *H01L 2224/0557* (2013.01); *H01L 2224/08146* (2013.01)

(58) Field of Classification Search
CPC ..... H01L 25/18; H01L 23/481; H01L 23/528; H01L 24/05; H01L 24/08; H01L 2224/0557; H01L 2224/08146
See application file for complete search history.

(56) References Cited

U.S. PATENT DOCUMENTS

| | | | |
|---|---|---|---|
| 8,146,032 B2 | 3/2012 | Chen et al. | |
| 9,065,722 B2 | 6/2015 | Thottethodi et al. | |
| 10,496,561 B2 | 12/2019 | Roberts et al. | |
| 2006/0206745 A1 | 9/2006 | Prengel et al. | |
| 2009/0166846 A1* | 7/2009 | Pratt | H01L 21/76898 257/E23.18 |
| 2014/0319697 A1* | 10/2014 | Janzen | H01L 23/481 257/774 |

(Continued)

OTHER PUBLICATIONS

International Search Report and Written Opinion in International Application No. PCT/US2020/052898, dated Dec. 7, 2020, 11 pages.

*Primary Examiner* — Shahed Ahmed
*Assistant Examiner* — Vicki B. Booker
(74) *Attorney, Agent, or Firm* — KOWERT HOOD MUNYON RANKIN AND GOETZEL PC; Rory D. Rankin

(57) ABSTRACT

Systems, apparatuses, and methods for routing traffic through vertically stacked semiconductor dies are disclosed. A first semiconductor die has a second die stacked vertically on top of it in a three-dimensional integrated circuit. The first die includes a through silicon via (TSV) interconnect that does not traverse the first die. The first die includes one or more metal layers above the TSV, which connect to a bonding pad interface through a bonding pad via. If the signals transferred through the TSV of the first die are shared by the second die, then the second die includes a TSV aligned with the bonding pad interface of the first die. If these signals are not shared by the second die, then the second die includes an insulated portion of a wafer backside aligned with the bonding pad interface.

20 Claims, 8 Drawing Sheets

(56) References Cited

U.S. PATENT DOCUMENTS

| | | | |
|---|---|---|---|
| 2016/0203253 A1 | 7/2016 | Fang | |
| 2017/0301657 A1* | 10/2017 | Fong | H01L 21/8221 |
| 2017/0365600 A1* | 12/2017 | Sinha | H01L 24/14 |
| 2020/0058646 A1* | 2/2020 | Gomes | H01L 29/785 |
| 2020/0091112 A1* | 3/2020 | Do | H01L 24/09 |

* cited by examiner

SCHEME FOR ENABLING DIE REUSE IN 3D STACKED PRODUCTS

BACKGROUND

Description of the Related Art

Progress has been made in three-dimensional integrated circuits (3D ICs) that include two or more layers of active electronic components integrated both vertically and horizontally into a single circuit. Components within these layers communicate using on-chip signaling, whether vertically or horizontally. In various embodiments, through silicon vias (TSVs) and groups of TSVs forming through silicon buses are used as interconnects between a base die at the bottom of a vertical stack of dies and one or more other dies stacked on top of the base die and one another. When the stacked dies are of a same type, the through silicon buses used as interconnects for signals and power connections are aligned between the stacked dies. However, when a particular die in the stack is a different type of die than a die above or below the particular die, the interconnects may not be aligned. In addition, a particular die may interface with different dies for different applications, and those different dies may have different numbers of interface signals.

In some designs, dies may have multiple masks to allow for the fabrication of different interfaces to other dies based on the particular stack used in a product. However, maintaining multiple masks for a die is expensive. In addition, some designs are restricted on locations for the interconnects. For example, a memory die in a vertical stack includes multiple memory array banks which cannot be moved or perforated to allow room for the multiple TSVs (and buses) and their corresponding keep out zones.

In view of the above, efficient methods for routing traffic through vertically stacked semiconductor dies are desired.

BRIEF DESCRIPTION OF THE DRAWINGS

The advantages of the methods and mechanisms described herein may be better understood by referring to the following description in conjunction with the accompanying drawings, in which.

Figure 1:
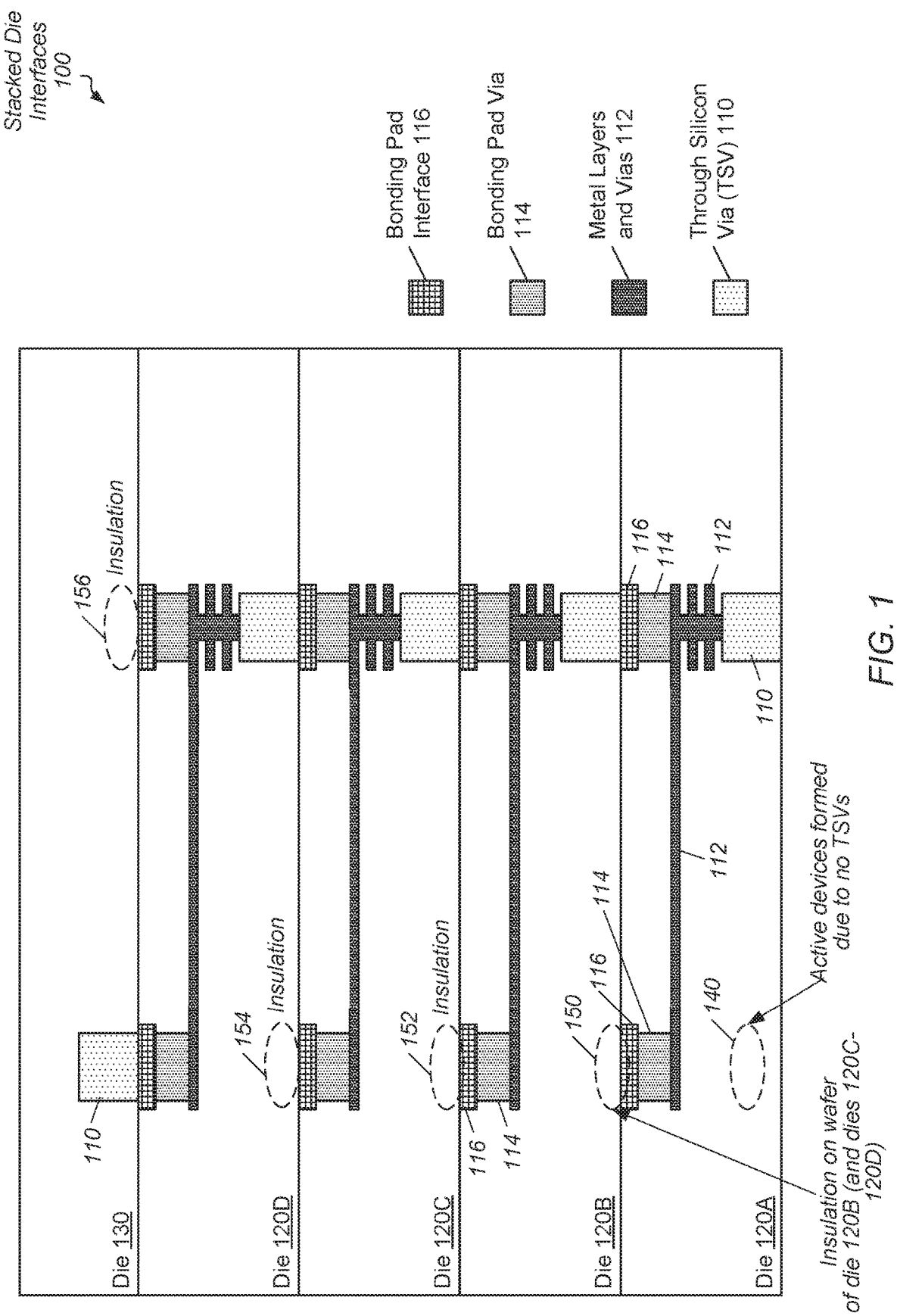
FIG. 1 is a block diagram of one embodiment of stacked die interfaces.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION OF EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for routing traffic through vertically stacked semiconductor dies are disclosed. In various embodiments, a computing system includes two or more vertically stacked semiconductor dies as used in a variety of three dimensional (3D) integrated circuits (ICs). A first semiconductor die includes a first interface for receiving one or more signals. In an embodiment, the first interface is a through silicon via (TSV) interconnect that does not fully traverse (i.e., does not fully extend across) the first semiconductor die. The first semiconductor die (or first die) includes one or more metal layers above the TSV.

In addition, the first die includes a second interface at the top of the first die. In an embodiment, the second interface includes one or more bonding pad vias connected to the one or more metal layers. Additionally, the first die includes one or more bonding pad interconnects used as a bonding interface above the bonding pad vias. In various embodiments, the bonding pad vias and the bonding pad interconnects are vias and interconnects using bump interconnects, micro bump interconnects, or other. When a potential is applied to a power node of the first semiconductor die, a current is conveyed along the one or more signals from the TSV at the bottom of the first die to the bonding pad interface at the top of the first die.

In various embodiments, a second semiconductor die (or second die) stacked vertically on the first die includes a TSV aligned with the bonding pad interface of the first die. In some embodiments, the second die provides a different functionality than the first die. In such cases, the first die and the second die use different masks, and one or more TSVs of the second die are not aligned with TSVs of the first die. In an embodiment, the first die includes a third interface at the top of the first die. The second interface and the third interface are placed at different, non-adjacent locations at the top of the first die. The third interface also includes one or more bonding pad vias connected to the one or more metal layers, and one or more bonding pad interconnects used as a bonding interface.

The third interface transfers the same signals as the second interface between the first die and the second die. An extension in one of the metal layers routes one or more signals to the third interface. Therefore, these one or more signals are routed vertically between the second interface at the top of the first die and the first interface (TSV) at the bottom of the first die. One or more of these signals are routed horizontally using the extension to the third interface. Below the third interface, no area is removed for a TSV and corresponding keep out zones. Therefore, there is room for placement of active devices (e.g., transistors) which would not otherwise be the case.

In one embodiment, a signal transferred between the first die and the second die is a power supply signal or a ground reference signal. The second interface and the third interface at the top of the first die allows the first die and the second die to share power connections. In other embodiments, the column including the TSV, the metal layers, the active devices, and the bonding pad interface is replicated in the first die for routing signals shared by the first die and the second die. Examples of the shared signals are addresses, response data, write data, control signals, and so on. In some embodiments, when the second die does not use signals routed to the bonding pad interface at the top of the first die, the second die includes an insulated portion of a wafer backside aligned with the bonding pad interface.

Referring to FIG. 1, a generalized block diagram illustrating stacked die interfaces 100 is shown. Semiconductor dies (or dies) 120A-120D are stacked on top of one another. Die 130 is at the top of the stack of dies 120A-120D. Die-stacking technology is a fabrication process that enables the physical stacking of multiple separate pieces of silicon (integrated chips) together in a same package with high-bandwidth and low-latency interconnects. In various embodiments, the dies 120A-120D and 130 are included in a System in Package (SiP), which utilizes three-dimensional (3D) integrated circuits (ICs). A 3D IC includes two or more layers of active electronic components integrated both vertically and/or horizontally into a single circuit. Here, vertical integration is shown. An interposer, a package substrate, solder interconnects, a printed circuit board, as well as diffusion regions and active regions within the dies 120A-120D and 130, and so on, are not shown for ease of illustration.

In an embodiment, each of the dies 120A-120D provides a same functionality, whereas die 130 provides a different functionality. It is contemplated that dies 120A-120D and 130 include one or more of a variety of processing units, a cache memory subsystem, data storage arrays, a communication interconnect, and so on. Although a single die 130 is shown stacked on top of a stack of four dies 120A-120D, it is possible and contemplated that another number of dies and another number of types of dies are used in other embodiments of vertically stacked dies of a 3D IC. As the dies 120A-120D and 130 are stacked vertically as in three dimensional (3D) integrated circuits (ICs), in some embodiments, particular routes use vertical hops between the vertically stacked dies 120A-120D and 130. These routes include signal routes such as commands and packets, address information, response data, write data and so on. The routes also include power connection routes such as one or more power supply lines for conveying power supply voltage levels and ground reference voltage levels.

In various embodiments, the vertically stacked dies 120A-120D and 130 use through silicon via interconnects. The active device layer of each of the dies 120A-120D and 130, which are stacked on top of one another, have direct vertical interconnects tunneling, or otherwise traversing, through them. The vertical interconnects use multiple through silicon vias 110 grouped together to form through silicon buses (TSBs). The TSBs are used as a vertical electrical connection traversing through a silicon wafer. The TSVs 110 and TSBs are an alternative interconnect to wire-bond and flip chips.

A corresponding keep out zone for an individual TSV 110 defines an area around the TSV 110 providing a predicted stress to an active device to be above a threshold. The stress is caused by the placement of the TSV 110. Areas outside of the keep out zone provide a predicted stress to an active device to be below the threshold. The size and density of the TSVs 110 that can tunnel between the different device layers varies based on the underlying technology used to fabricate the 3D ICs. In some embodiments, the vertically stacked dies 120A-120D do not include a TSV 110 tunneling entirely through each of them to transport signals between them and other dies. Rather, the TSV 110 tunnels through a silicon substrate and oxide layers and ends at the metal layers 112. The metal layers 112 can be any of the metal layers from the lowest metal zero (M0) layer to the highest metal layer used by a particular die. In some embodiments, the TSV 110 reaches the upper metal layers and goes no farther. Therefore, no active devices (transistors) are formed where the TSV 110 is formed.

The one or more metal layers and corresponding vias are represented by metal layers 112, and they are referred to as metal layers 112 for simplicity although multiple metal layers and corresponding vias are also included. Above the metal layers 112 is a bonding pad via 114 (or via 114) used to connect the metal layers 112 to the bonding pad interface 116. In some embodiments, the bonding pad interface 116 includes one of a variety of interface technologies that does not use a TSV 110 traversing through an entire die. For example, in an embodiment, the bonding pad interface 116 (or interface 116) includes one of a variety of bump and micro bump interface technologies. However, rather than connect a die to a bump or solder ball below it to an external interposer or package substrate, such as is done for flip chip packages, here, the interface 116 connects the circuits of a die to a TSV 110 of another die vertically stacked above it. For example, on the far right of die 120A, the interface 116 connects die 120A to the TSV 110 of die 120B vertically stacked above it. A wire bond is not used and a TSV 110 tunneling through die 120A is not used for the connection.

Similar to flip chip packages, the location of the interface 116 can be located where needed for the circuits of die 120A, rather than located at a predetermined input/output (I/O) ring. In an embodiment, the mask for the dies 120A-120D provides two locations, rather than one location, for routing one or more signals through the die. As shown, the metal layers 112 include an upper level metal layer to route the one or more signals to the left to another via 114 and another interface 116. Therefore, there are two options for routing the one or more signals. In other embodiments, other routes of the same metal layer and of other metal layers are used to route the one or more signals to a third pair of via 114 and interface 116, to a fourth pair of via 114 and interface 116, and so on. The additional pairs of via 114 and interface 116 provide greater flexibility with a single mask for interfacing the die 120A with other dies, which may be different dies with different functionality. In addition, the additional pairs of via 114 and interface 116 provide room for active devices (transistors) to be formed. If two TSVs 110 were used to tunnel through the die 120A to route signals, then the area shown by the dashed oval 140 would not be available for forming active regions used to create active devices.

In an embodiment, the pair of via 114 and interface 116 is used to route a power supply signal such as a power supply voltage level or a ground reference voltage level. In some cases, a die stacked vertically on top of die 120A uses both available connections. In other cases, only one connection of the two available connections is used. For example, in the illustrated embodiment, the right available connection is used by dies 120A-120D, whereas, the left available connection is not used. However, the die 130 uses the left available connection, whereas, the die 130 does not use the right available connection. In another 3D IC, the left available connection may be used, whereas, the right available connection may not be used. With a single mask, the die 120A provides flexibility to be used in multiple 3D ICs.

In each of the areas where available connections to interface 116 is unused, the backside of the wafer of the die above the interface 116 includes insulation. This insulation is similar to insulation used in flip chip packages where bonding pads are not aligned or simply unused by circuitry of a die being placed on an interposer or a package substrate. The dashed ovals 150, 152, 154 and 156 show areas where this insulation is used. These areas 150-156 are the areas aligned with the below interface 116 on the left side of dies 120B-120D and the right side of die 130.

Figure 2:
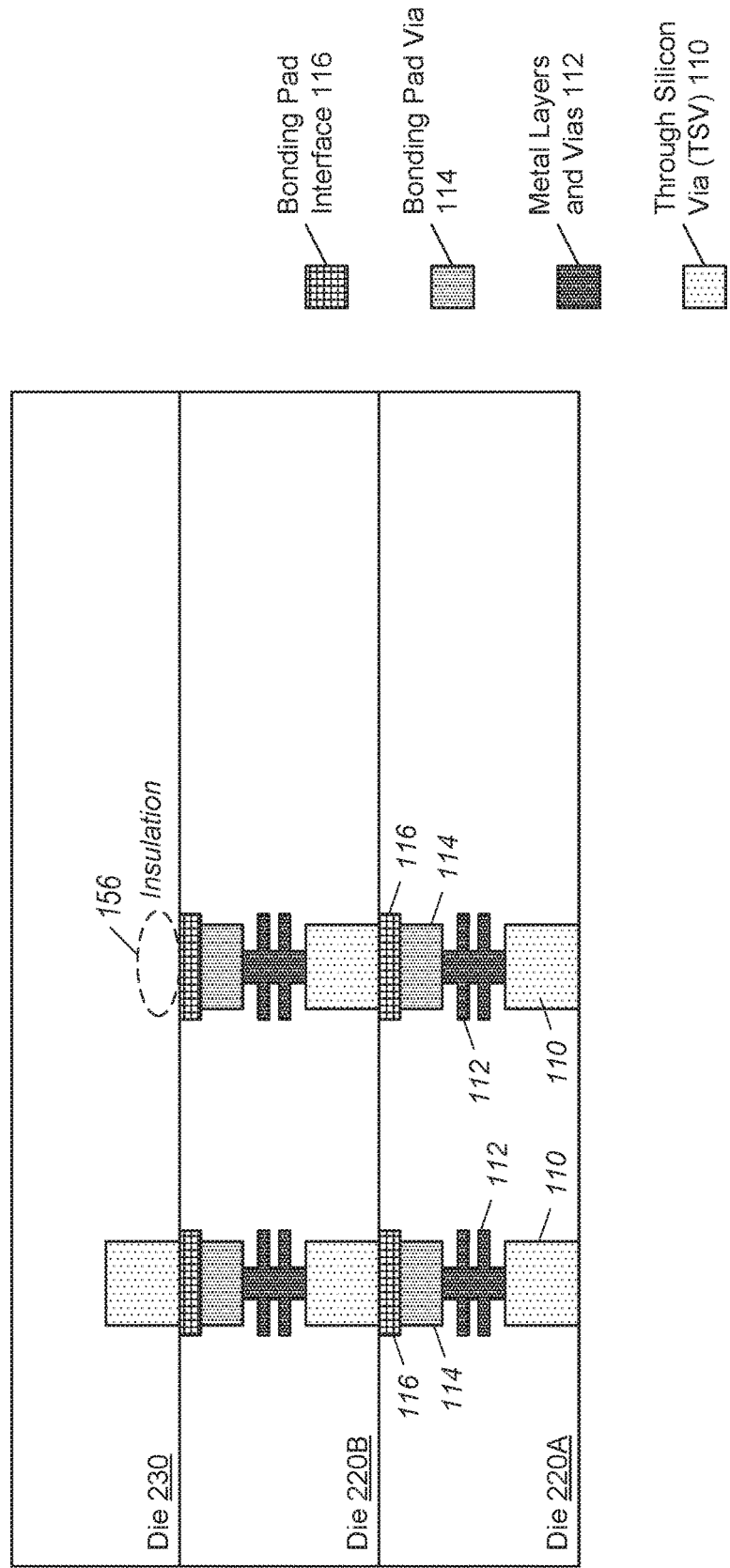
FIG. 2 is a block diagram of one embodiment of stacked die interfaces.

Referring to FIG. 2, a generalized block diagram illustrating stacked die interfaces 200 is shown. Semiconductor dies (or dies) 220A-220B are vertically stacked on top of one another. Die 230 is at the top of the stack of dies 220A-220B. Semiconductor fabrication materials, layers and components previously described are numbered identically. In various embodiments, the dies 220A-220B and 230 are included in a System in Package (SiP), which utilizes 3D ICs. An interposer, a package substrate, solder interconnects, a printed circuit board, as well as diffusion regions and active regions within the dies 120A-120D and 130, and so on, are not shown for ease of illustration. In an embodiment, each of the dies 220A-220B provides a same functionality, whereas, die 230 provides a different functionality.

In various embodiments, the vertically stacked dies 220A-220B do not include a TSV 110 traversing entirely through each of them to transport signals between them and other dies. Rather, the dies 220A-220B use a combination of the TSV 110, the metal layers 112, the via 114 and the interface 116 as described earlier. In some embodiments, the metal layers 112 do not route signals to a second interface 116 as shown earlier. Rather, the combination of TSV 110 to interface 116 is replicated for different signals. Therefore, when die 220B interfaces with die 230, which uses a different bandwidth interface, the die 230 makes a connection with only one of the two below interfaces 116. In the design shown, the die 230 has a TSV 110 (or TSB depending on the number of signals) making a connection with the left available interface 116 of the die 220B.

In some embodiments, a die used in a 3D IC uses the structural topology shown earlier in FIG. 1 for power connections, and the die uses the structural topology shown in FIG. 2 for routing signal buses. The die uses a single mask although it can be used in different products and interfacing with other different dies. Dies 220A-220B use a same bus bandwidth for signals routed through the two interfaces 116. However, die 230 has an interface supporting a portion of this bandwidth such as half of the bandwidth. In one example, a 32-bit bus is routed between dies 220A-220B and 230. The interface for die 230, though, supports 16 bits being simultaneously transferred. In one embodiment, the dies 220A-220B include selection circuitry, such as multiplexers, for selecting between transferring all 32 bits, or the full bandwidth, a first half of the 32 bits, and a second half of the 32 bits. When transferring half of the bandwidth, the total amount of time to transfer the data doubles when using the same clock rate.

Die 220A transfers data at the full bandwidth using the left and right interfaces 116 at the top of die 220A. Die 220B also transfers data at the bottom of die 220B using the full bandwidth. However, die 220B transfers data at half, or another portion, of the full bandwidth at the top of die 220B. Die 230 includes interface logic only for the left interface 116 at the top of die 220B. Control logic for selection circuitry at the top of die 220B sends data at a portion of the full bandwidth each clock cycle supported by the dies 220B and 230.

Figure 3:
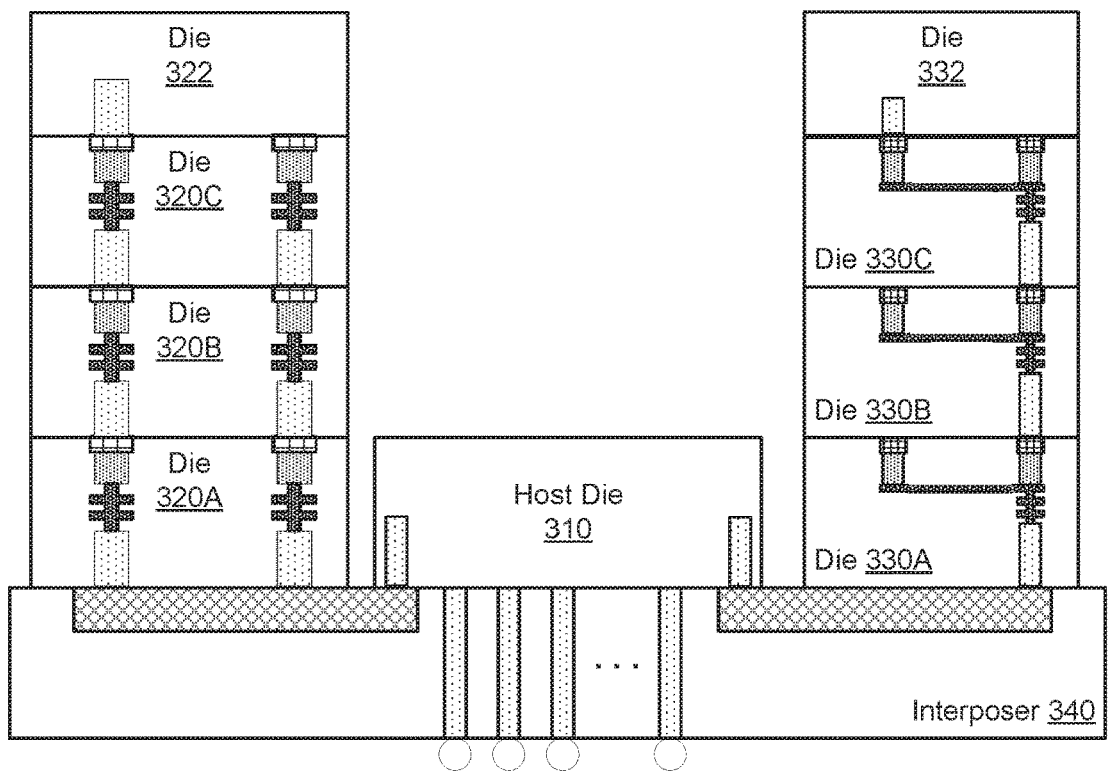
FIG. 3 is a block diagram of an embodiment of a system-in-package.
Figure 3:
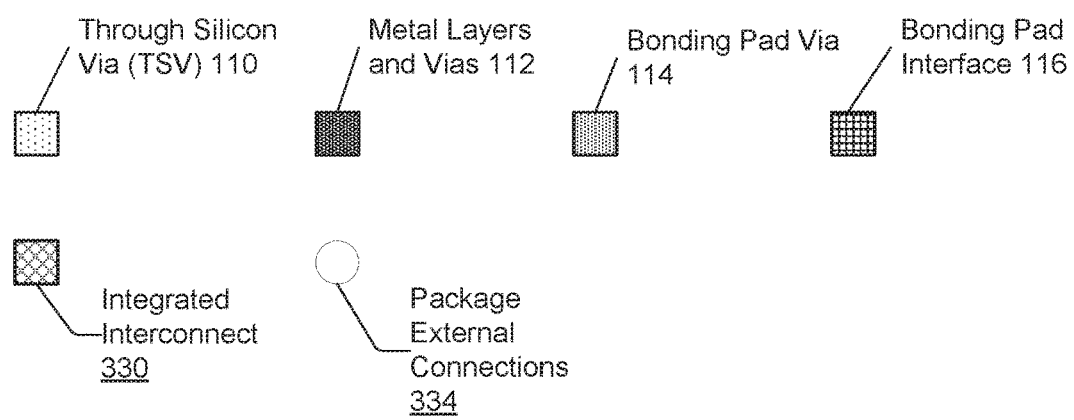

Turning now to FIG. 3, a generalized block diagram of one embodiment of a system-in-package (SiP) 300 is shown. Semiconductor fabrication materials, layers and components previously described are numbered identically. In various embodiments, three-dimensional (3D) packaging is used within a computing system to create the SiP 300. In one embodiment, interposer-based integration is used whereby the 3D IC is placed next to the host die 310. A printed circuit board (not shown) is located below the interposer 340 or package substrate and communicates with the host die 310 through the package external connections 334. As shown, in one embodiment, the SiP 300 includes the host die 310 and multiple three-dimensional (3D) dies 320A-320C, 322, 330A-330C and 332. Although six dies are shown, any number of dies, any number of types of dies, and any order of vertical stacking is used in other embodiments.

In some embodiments, the host die 310 is a processing unit such as a general-purpose central processing unit; a graphics processing unit (GPU), an accelerated processing unit (APU), a field programmable gate array (FPGA), or other data processing device. In an embodiment, the SiP 300 uses a network on a chip (NoC) communication subsystem. Requests, such as memory requests, generated by the host die 310 and responses provided by one or more of the dies 320A-320C, 322, 330A-330C and 332 are transferred in packets. Each packet uses an identifier for the source, an identifier for the destination, one or more control signals and a data payload. To support the NoC communication, the host die 310 uses interfaces with the vertically stacked dies 320A-320C, 322, 330A-330C and 332 and off-chip peripheral devices and functional units (not shown) which support both synchronous and asynchronous clock domains.

The in-package horizontal, low-latency integrated interconnect 330 (or interconnect 330) provides reduced lengths of interconnect signals versus long off-chip interconnects when a SiP is not used. The interconnect 330 uses particular signals and protocols as if the chips, such as the host die 310 and the dies 320A-320C, 322, 330A-330C and 332, were mounted in separate packages on a circuit board. In some embodiments, the SiP 300 additionally includes backside vias or through-bulk silicon vias 110 that reach to package external connections 334. The package external connections 334 are used for input/output (I/O) signals and power signals.

Dies 330A-330C include the earlier structural configuration of TSV 110 to bonding pad interface 116 described earlier in FIG. 1. Similarly, dies 320A-320C include the earlier structural configuration of TSV 110 to bonding pad interface 116 described earlier in FIG. 2. However, each of the dies 320A-320C and 330A-330C are capable of using both structural configurations. By using these configurations, the dies 320A-320C and 330A-330C provide more room for forming active regions and corresponding active devices (transistors) and allow only one mask to be supported for the dies although the die may be used in another configuration in another SiP.

Figure 4:
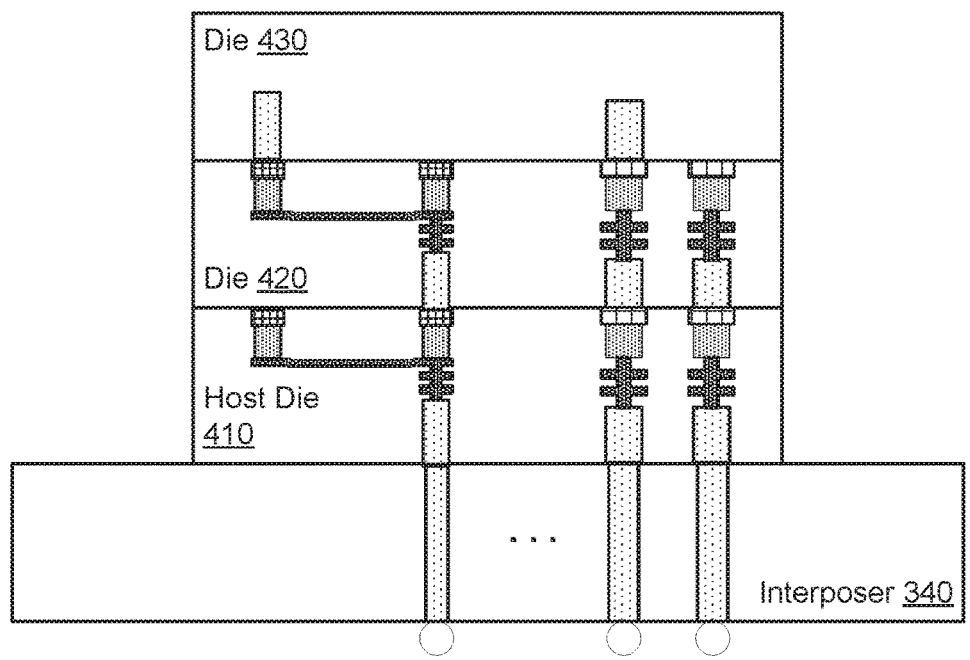
FIG. 4 is a block diagram of an embodiment of a system-in-package.
Figure 4:
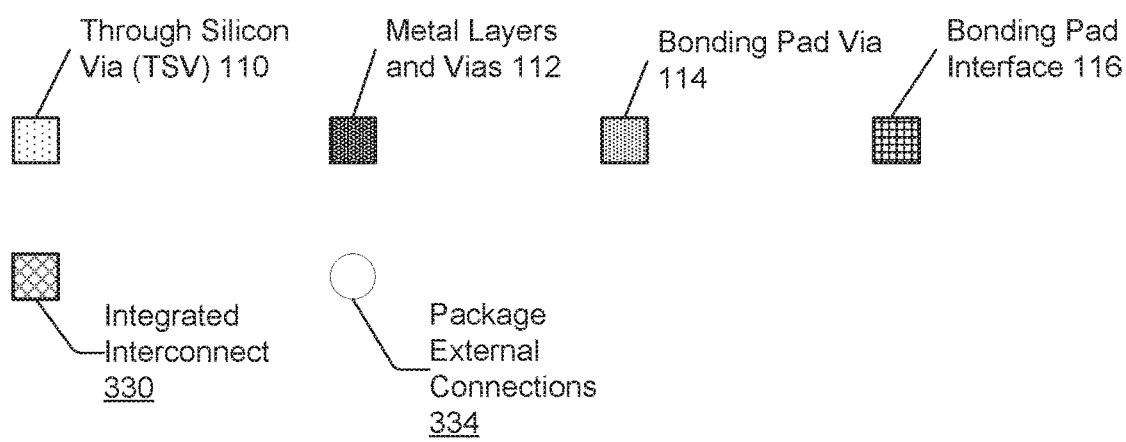

Referring to FIG. 4, a generalized block diagram of another embodiment of a system-in-package (SiP) 400 is shown. Circuitry, logic, semiconductor fabrication materials, layers and components described earlier are numbered identically. In the illustrated embodiment, SiP 400 includes the dies 420 and 430 stacked vertically and directly on top of the host die 410. Although three dies are shown, any number of dies, any number of types of dies, and any order of vertical stacking is used in other embodiments. The dies 410 and 420 support communication between dies without using TSVs 110 (or TSBs) tunneling, or otherwise traversing, through them. The dies 410 and 420 are capable of using one or both of the structural configurations described earlier in FIG. 1 and FIG. 2 for routing signals between dies. Therefore, the dies 410 and 420 provide more room for forming active regions and corresponding active devices (transistors) and allow only one mask to be supported for the dies although the die may be used in another configuration in another SiP.

Figure 5:
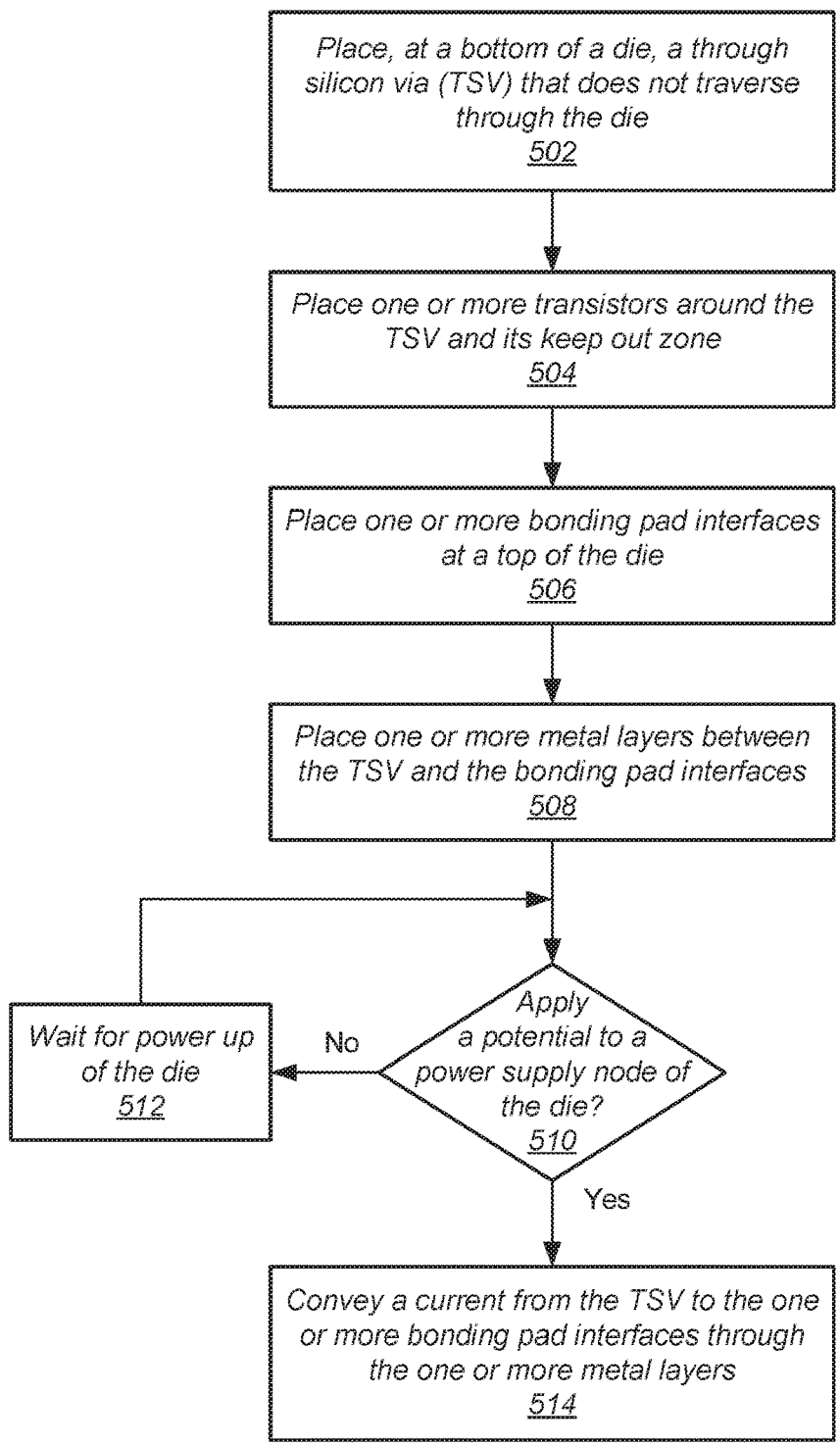
FIG. 5 is a flow diagram of one embodiment of a method for calibrating an on-die termination resistor in a computing system.

Referring now to FIG. 5, one embodiment of a method 500 for routing traffic through vertically stacked semiconductor dies is shown. For purposes of discussion, the steps in this embodiment (as well as in FIG. 6) are shown in sequential order. However, it is noted that in various embodiments of the described methods, one or more of the elements described are performed concurrently, in a different order than shown, or are omitted entirely. Other additional elements are also performed as desired. Any of the various systems or apparatuses described herein are configured to implement method 500.

One or more of a semiconductor chip designer, an automated synthesis tool, and a fabrication process places, at a bottom of a semiconductor die, a through silicon via (TSV) that does not traverse through the semiconductor die (block 502). One or more transistors are placed in areas outside of the TSV and its corresponding keep out zone (block 504). One or more bonding pad interfaces are placed at a top of the semiconductor die (or die) (block 506).

One or more metal layers are placed between the TSV and the bonding pad interfaces (block 508). Therefore, a vertical column is created in the die that includes the TSV at the bottom of the die, the metal layers in the middle of the die, and the bonding pad interface at the top of the die. One or more signals are vertically routed through the die while retaining room for fabrication of active devices (transistors) outside the area of the TSV and its corresponding keep out zone. In an embodiment, the die includes another bonding pad interface at the top of the die that is not vertically aligned with the TSV. In an embodiment, this additional bonding pad interface transfers the same signals as the aligned bonding pad interface. A horizontal extension in one of the metal layers routes one or more of the vertical signals from the TSV to the additional bonding pad interface.

If a potential, such as power supply voltage level, is not applied to a power supply node of the die ("no" branch of the conditional block 510), then the die waits for power up (block 512), and control flow of method 500 returns to the conditional block 510. If the potential is applied to the power supply node of the die ("yes" branch of the conditional block 510), then a current is conveyed from the TSV at the bottom of the die to one or more bonding pad interfaces at the top of the die through the one or more metal layers (block 514).

Figure 6:
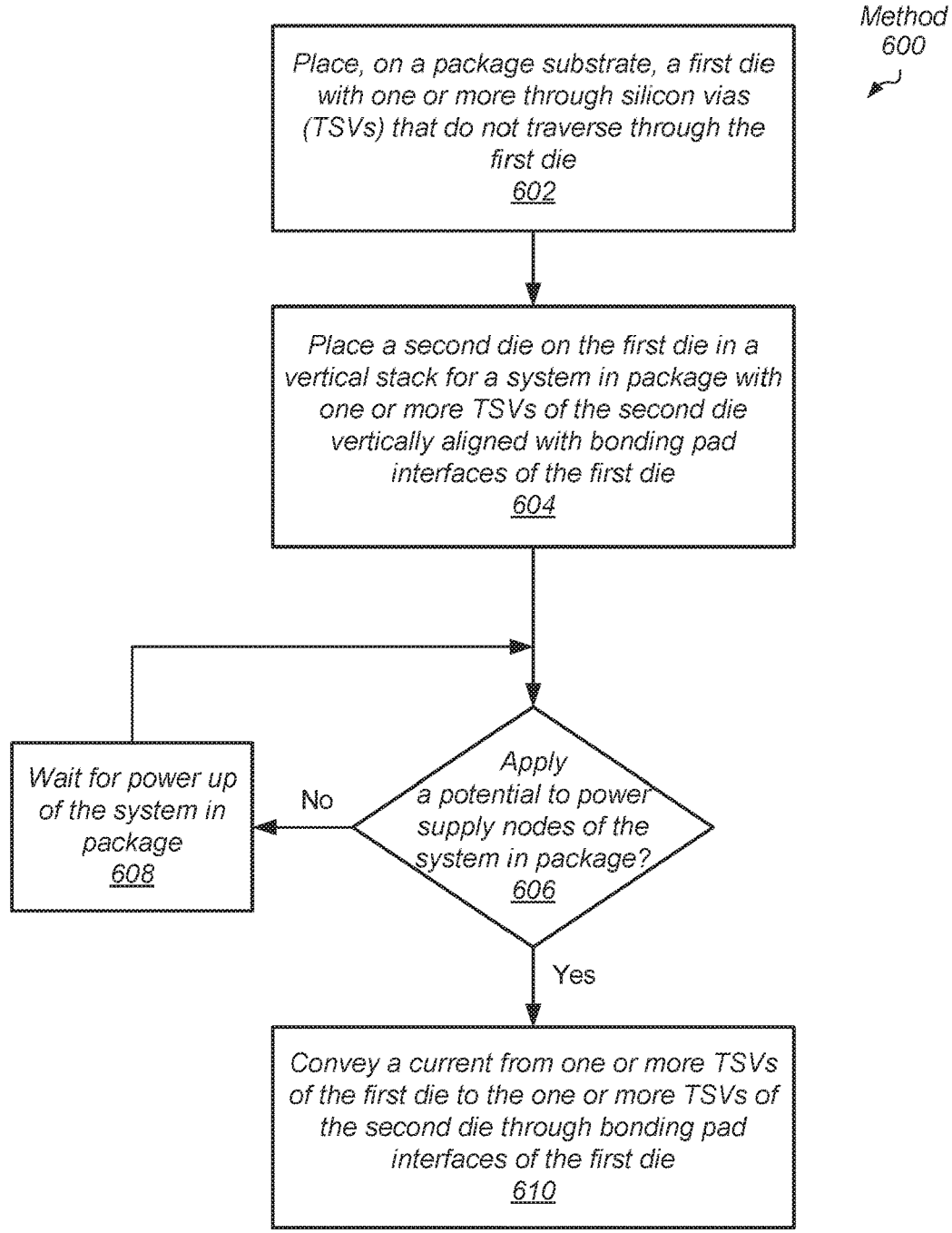
FIG. 6 is a flow diagram of one embodiment of a method for calibrating an on-die termination resistor in a computing system.

Referring now to FIG. 6, one embodiment of a method 600 for routing traffic through vertically stacked semiconductor dies is shown. On a package substrate, a first die is placed with one or more through silicon vias (TSVs) that do not traverse through the first die (block 602). A second die is placed on the first die in a vertical stack with one or more TSVs of the second die vertically aligned with bonding pad interfaces of the first die (block 604). In some embodiments, when the second die does not use signals routed to the bonding pad interface at the top of the first die, the second die includes an insulated portion of a wafer backside aligned with the bonding pad interface. In various embodiments, the first die and the second die are used in three-dimensional (3D) packaging for a computing system. This type of packaging is referred to as a System in Package (SiP).

If a potential, such as a power supply voltage level, is not applied to power supply nodes of the SiP ("no" branch of the conditional block 606), then the SiP waits for power up (block 608), and control flow of method 600 returns to the conditional block 606. If the potential is applied to the power supply nodes of the SiP ("yes" branch of the conditional block 606), then a current is conveyed from one or more TSVs at the bottom of the first die to one or more TSVs at the bottom of the second die through one or more bonding pad interfaces at the top of the first die (block 610).

Figure 7:
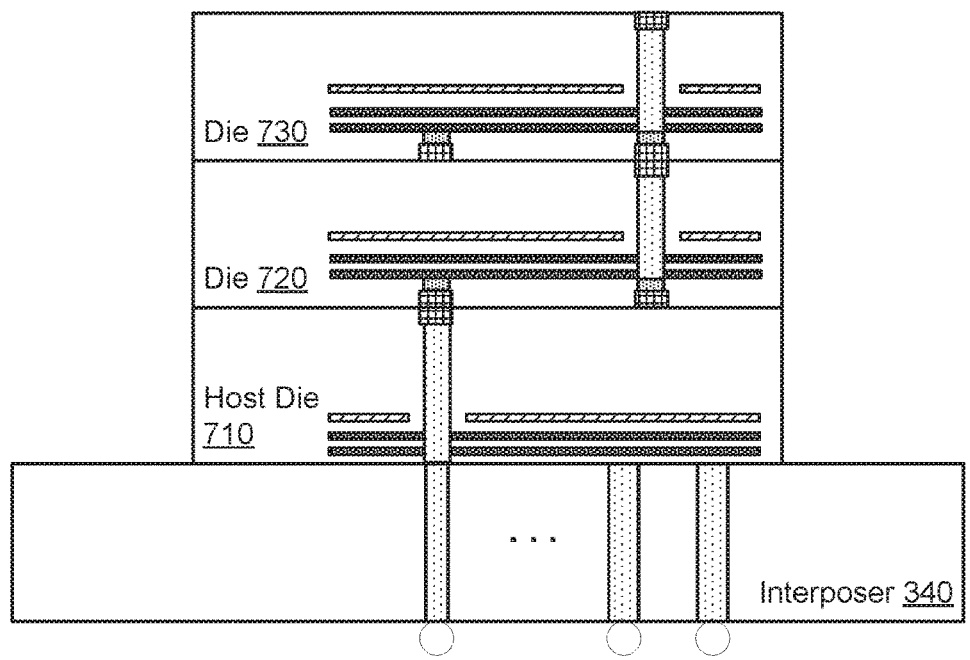
FIG. 7 is a block diagram of an embodiment of a system-in-package.

Referring to FIG. 7, a generalized block diagram of another embodiment of a system-in-package (SiP) 700 is shown. Circuitry, logic, semiconductor fabrication materials, layers and components described earlier are numbered identically. In the illustrated embodiment, SiP 700 includes the dies 720 and 730 stacked vertically and directly on top of the host die 710. Although three dies are shown, any number of dies, any number of types of dies, and any order of vertical stacking is used in other embodiments. The regions for active devices (transistors) 740 are shown for each of the dies 710, 720 and 730. The front sides of the dies 710-730 are located at the bottom of the dies 710-730. The back sides of the dies 710-730 are located at the top of the dies 710-730. Therefore, the regions for active devices 740 are shown located above the metal layers 112.

The dies 710 and 720 support communication between them without using aligned TSVs 110 (or TSBs) tunneling, or otherwise traversing, through them. The dies 710 and 720 are capable of using one or both of the structural configurations described earlier in FIG. 1 and FIG. 2 for routing signals between dies. Therefore, the dies 710 and 720 provide more room for forming active devices (transistors) 740 and allowing only one mask to be supported for the dies although the die may be used in another configuration in another SiP.

Figure 8:
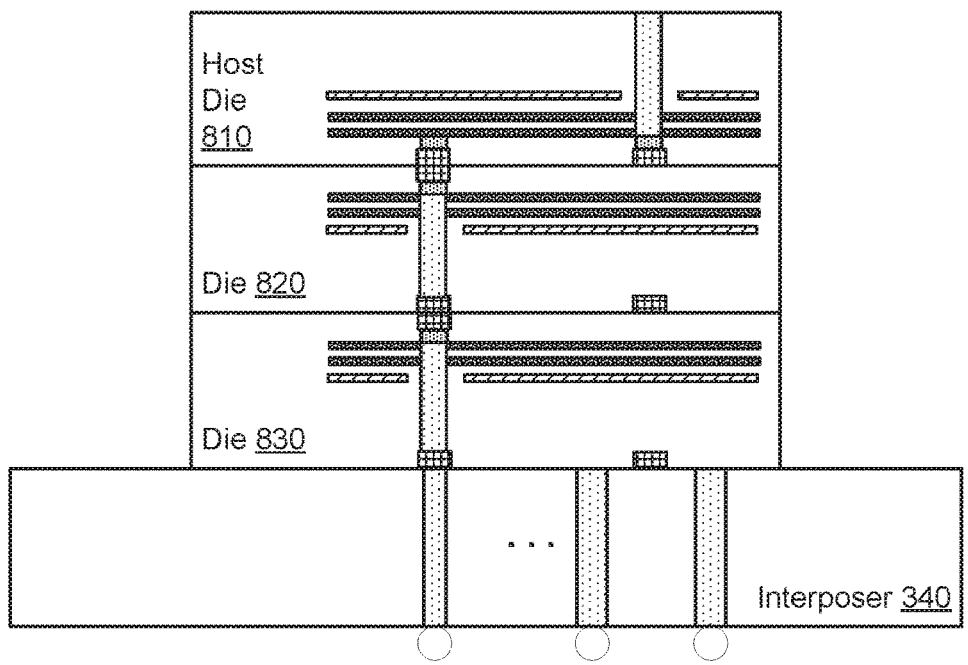
FIG. 8 is a block diagram of an embodiment of a system-in-package.
Figure 8:
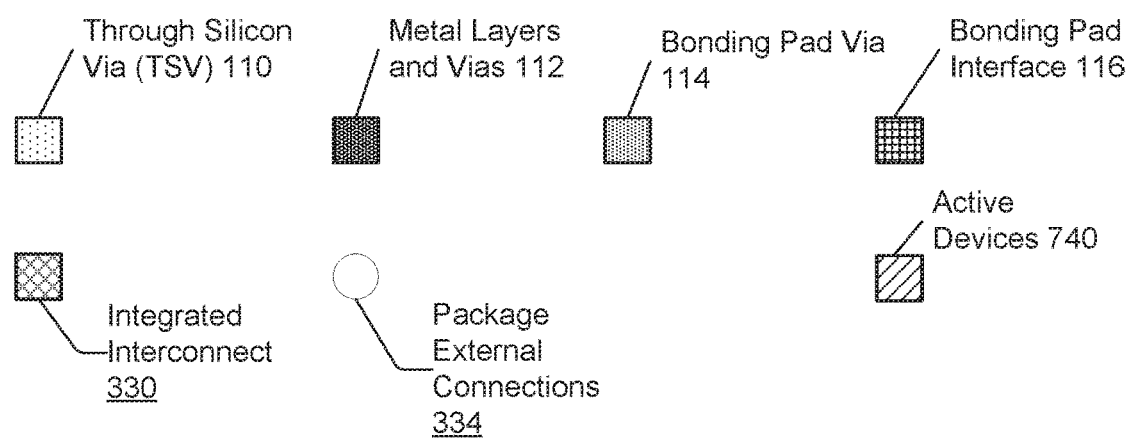

Turning to FIG. 8, a generalized block diagram of another embodiment of a system-in-package (SiP) 800 is shown. Circuitry, logic, semiconductor fabrication materials, layers and components described earlier are numbered identically. In the illustrated embodiment, SiP 800 includes the die 820 vertically stacked on top of die 830, and host die 810 vertically stacked on top of die 820. Similar to SiPs 300, 400 and 700, the SiP 800 includes three dies. However, although three dies are shown for SiP 800, any number of dies, any number of types of dies, and any order of vertical stacking is used in other embodiments. The regions for active devices (transistors) 740 are shown for each of the dies 810, 820 and 830. The front side of the host die 810 is located at the bottom of the host die 810. In contrast, the front sides of the dies 820 and 830 are located at the tops of the dies 820 and 830. Therefore, the regions for active devices 740 are shown located above the metal layers 112 for host die 810, but below the metal layers 112 for dies 820 and 830.

The dies 810 and 820 support communication between them without using aligned TSVs 110 (or TSBs) tunneling, or otherwise traversing, through them. The dies 810 and 820 are capable of using one or both of the structural configurations described earlier in FIG. 1 and FIG. 2 for routing signals between dies. Therefore, the dies 810 and 820 provide more room for forming active devices (transistors)

740 and allowing only one mask to be supported for the dies although the die may be used in another configuration in another SiP.

In various embodiments, program instructions of a software application are used to implement the methods and/or mechanisms previously described. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computing system during use to provide the program instructions and accompanying data to the computing system for program execution. The computing system includes at least one or more memories and one or more processors that execute program instructions.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A system comprising:
a first semiconductor die; and
a second semiconductor die stacked vertically on the first semiconductor die; and
wherein the first semiconductor die includes:
a first interface configured to receive one or more signals; and
one or more metal layers above the first interface; and
wherein responsive to a potential being applied to a power node of the first semiconductor die, a current is conveyed through the first semiconductor die between the first interface and the second semiconductor die by both of:
a second interface, different from the first interface, used in a first vertical signal route between the first semiconductor die and the second semiconductor die at a first location on the first semiconductor die; and
a third interface, different from each of the first interface and the second interface, used in a second vertical signal route different from the first vertical signal route between the first semiconductor die and the second semiconductor die at a second location that is a different, non-adjacent location on the first semiconductor die from the first location.

2. The system as recited in claim 1, wherein the second interface is aligned with the first interface and the third interface is unaligned with the first interface.

3. The system as recited in claim 1, wherein the first semiconductor die further comprises a plurality of transistors below the third interface and above the first interface.

4. The system as recited in claim 1, wherein the first interface of the first semiconductor die comprises a through silicon via interconnect that tunnels through a silicon substrate and oxide layers and ends at metal layers such that the through silicon via interconnect does not fully traverse the first semiconductor die.

5. The system as recited in claim 1, wherein one or more of the second interface and the third interface comprises:
one or more bonding pad vias connected to the one or more metal layers; and
a bonding pad interface comprising one or more bump interconnects.

6. The system as recited in claim 5, wherein the second semiconductor die comprises a through silicon via interconnect aligned with one of the second interface and the third interface for transferring signals between the second semiconductor die and the first semiconductor die.

7. The system as recited in claim 1, wherein the second semiconductor die:
has no contact or via at a given interface of the second interface and the third interface; and
includes an insulated portion of a wafer backside aligned with the given interface.

8. The system as recited in claim 1, wherein the second semiconductor die provides a different functionality than the first semiconductor die.

9. A system comprising:
a first semiconductor die comprising:
a first interface configured to receive one or more signals;
one or more metal layers above the first interface;
a second interface, different from the first interface, for use in a first vertical signal route, between the first semiconductor die and a second semiconductor die, at a first location on the first semiconductor die;
a third interface, different from each of the first interface and the second interface, used in a second vertical signal route different from the first vertical signal route between the first semiconductor die and the second semiconductor die at a second location that is a different, non-adjacent location on the first semiconductor die from the first location;
wherein responsive to a potential being applied to a power node of the first semiconductor die, a current is conveyed through the first semiconductor die between the first interface and the second semiconductor die by both of:
the second interface; and
the third interface.

10. The system as recited in claim 9, wherein the second interface is aligned with the first interface and the third interface is unaligned with the first interface.

11. The system as recited in claim 9, wherein the first semiconductor die further comprises a plurality of transistors below the third interface.

12. The system as recited in claim 9, wherein the first interface of the first semiconductor die comprises a through silicon via (TSV) interconnect that does not traverse through the first semiconductor die.

13. The system as recited in claim 9, wherein one or more of the second interface and the third interface comprises:
one or more bonding pad vias connected to the one or more metal layers; and
a bonding pad interface comprising one or more bump interconnects.

14. The system as recited in claim 13, wherein the second semiconductor die comprises an insulated portion of a wafer backside aligned with one of the second interface and the third interface.

15. The system as recited in claim 13, wherein the second semiconductor die comprises a through silicon via (TSV) interconnect aligned with one of the second interface and the third interface for transferring signals between the second semiconductor die and the first semiconductor die.

16. A system in a package comprising:
a first semiconductor die stack coupled to a host die; and
a second semiconductor die stack coupled to the host die;

wherein the first semiconductor die stack comprises:
a first semiconductor die, wherein the first semiconductor die includes:
a first interface configured to receive one or more signals; and
one or more metal layers above the first interface; and
wherein responsive to a potential being applied to a power node of the first semiconductor die, a current is conveyed through the first semiconductor die between the first interface and the second semiconductor die by both of:
a second interface, different from the first interface, used in a first vertical signal route between the first semiconductor die and the second semiconductor die at a first location on the first semiconductor die; and
a third interface, different from each of the first interface and the second interface, used in a second vertical signal route different from the first vertical signal route between the first semiconductor die and the second semiconductor die at a second location that is a different, non-adjacent location on the first semiconductor die from the first location.

17. The system in a package as recited in claim 16, wherein the second interface is aligned with the first interface and the third interface is unaligned with the first interface.

18. The system in a package as recited in claim 16, wherein the first semiconductor die further comprises a plurality of transistors below the third interface.

19. The system in a package as recited in claim 16, wherein the first interface of the first semiconductor die comprises a through silicon via (TSV) interconnect that does not traverse through the first semiconductor die.

20. The system in a package as recited in claim 16, wherein one or more of the second interface and the third interface comprises:
one or more bonding pad vias connected to the one or more metal layers; and
a bonding pad interface comprising one or more bump interconnects.

* * * * *